(12) United States Patent
Kim

(10) Patent No.: US 12,424,597 B2
(45) Date of Patent: Sep. 23, 2025

(54) DISPLAY DEVICE

(71) Applicant: Samsung Display Co., LTD., Yongin-si (KR)

(72) Inventor: Hyun Hyang Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 583 days.

(21) Appl. No.: 17/729,461

(22) Filed: Apr. 26, 2022

(65) Prior Publication Data

US 2023/0022739 A1    Jan. 26, 2023

(30) Foreign Application Priority Data

Jul. 26, 2021    (KR) .................. 10-2021-0098160

(51) Int. Cl.
*H10H 20/853* (2025.01)
*H01L 23/00* (2006.01)
*H01L 25/16* (2023.01)
*H10H 20/855* (2025.01)

(52) U.S. Cl.
CPC ......... *H01L 25/167* (2013.01); *H10H 20/853* (2025.01); *H01L 24/24* (2013.01); *H01L 2224/24051* (2013.01); *H01L 2224/24145* (2013.01); *H10H 20/855* (2025.01)

(58) Field of Classification Search
CPC ....... H01L 27/0248–0296; H01L 27/562–576; H01L 23/16–3192; H01L 23/3142; H01L 23/31; H01L 23/315; H01L 23/42; H01L 33/54; H01L 33/64; H01L 2933/0058; H10K 50/844; H10K 50/8445; H10K 59/38; H10K 59/122; H10K 59/124; H10K 59/126; H10K 59/87; H10K 59/873; H10K 59/8731; H10K 59/877; H10K 2102/311
See application file for complete search history.

(56) References Cited

U.S. PATENT DOCUMENTS

| | | | |
|---|---|---|---|
| 10,916,722 B2 | 2/2021 | Park et al. | |
| 10,978,518 B2 | 4/2021 | Ahn et al. | |
| 11,043,656 B2 | 6/2021 | Lee | |
| 11,770,960 B2 | 9/2023 | Choe | |
| 2010/0219429 A1* | 9/2010 | Cok | H10K 59/877 257/89 |
| 2020/0013766 A1 | 1/2020 | Kim | |
| 2020/0073040 A1* | 3/2020 | Lee | G02B 6/005 |
| 2020/0183224 A1* | 6/2020 | Lee | G02F 1/133606 |
| 2020/0219937 A1* | 7/2020 | Ahn | H10K 59/8792 |
| 2020/0251688 A1* | 8/2020 | Chung | H10K 59/875 |
| 2021/0028327 A1 | 1/2021 | Lin et al. | |

(Continued)

FOREIGN PATENT DOCUMENTS

| | | |
|---|---|---|
| KR | 10-1016045 | 2/2011 |
| KR | 10-2020-0005692 | 1/2020 |

(Continued)

*Primary Examiner* — Steven B Gauthier
*Assistant Examiner* — Adam D Weiland

(57) ABSTRACT

A display device includes pixels, each of the pixels including light emitting elements disposed in pixels, a color conversion layer disposed on the light emitting elements of the pixels, an optical layer disposed on the color conversion layer, and an organic layer disposed on the optical layer. At least one of the optical layer and the organic layer includes recess patterns disposed between the pixels.

11 Claims, 13 Drawing Sheets

(56) References Cited

U.S. PATENT DOCUMENTS

2021/0202594 A1    7/2021  Jo et al.
2022/0115469 A1*  4/2022  Huang ................. H10K 59/873
2022/0123183 A1    4/2022  Kim et al.

FOREIGN PATENT DOCUMENTS

| KR | 10-2020-0032294 | | 3/2020 |
| --- | --- | --- | --- |
| KR | 10-2020-0084969 | | 7/2020 |
| KR | 10-2020-0101552 | | 8/2020 |
| KR | 10-2021-0030538 | A | 3/2021 |
| KR | 10-2021-0084913 | | 7/2021 |
| KR | 10-2022-0051900 | | 4/2022 |

* cited by examiner

DISPLAY DEVICE

CROSS-REFERENCE TO RELATED APPLICATION(S)

This application claims priority to and benefits of Korean Patent Application No. 10-2021-0098160 under 35 U.S.C. § 119, filed on Jul. 26, 2021 in the Korean Intellectual Property Office, the entire contents of which are incorporated herein by reference.

BACKGROUND

1. Technical Field

The disclosure relates to a display device.

2. Description of the Related Art

As interest in information displays have been increasing, research and development of display devices have been continuously conducted.

SUMMARY

An object to be solved by the disclosure is to improve the reliability of a display device by minimizing warpage.

The objects of the disclosure are not limited to the above, and other advantages which are not described will be clearly understood by those skilled in the art from the following description.

According to an embodiment of the disclosure, a display device may include pixels, each of the pixels including light emitting elements disposed in the pixels, a color conversion layer disposed on the light emitting elements, an optical layer disposed on the color conversion layer, and an organic layer disposed on the optical layer. At least one of the optical layer and the organic layer includes recess patterns disposed between the pixels.

The display device may further include a first capping layer disposed between the color conversion layer and the optical layer, and a second capping layer disposed between the optical layer and the organic layer.

The display device may further include a third capping layer disposed in the recess patterns.

The third capping layer may not overlap the pixels in a plan view.

The display device may further include a central portion, and an outer portion surrounding the central portion. A number of the recess patterns disposed per unit area in the central portion may be less than a number of the recess patterns disposed per unit area in the outer portion.

The display device may further include a central portion, and an outer portion surrounding the central portion. A depth of the recess patterns disposed in the central portion may be less than a depth of the recess patterns disposed in the outer portion.

The display device may further include banks disposed between the pixels, and the color conversion layer may be disposed between the banks.

The display device may further include a color filter layer disposed on the organic layer.

A refractive index of the optical layer may be about 1.1 to about 1.3.

The optical layer may include a hollow particle.

According to an embodiment, a display device may include pixels, a bank including an opening that overlaps the pixels in a plan view, light emitting elements disposed in the pixels, a color conversion layer disposed on the light emitting elements, an optical layer disposed on the color conversion layer, and an organic layer disposed on the optical layer. The color conversion layer, the optical layer, and the organic layer may be disposed in the opening of the bank.

Each of the pixels may include a first sub-pixel and a second sub-pixel. The bank may be disposed between the first sub-pixel and the second sub-pixel.

The bank may separate a portion of the optical layer that overlaps the first sub-pixel in a plan view from a portion of the optical layer that overlaps the second sub-pixel in a plan view.

The bank may separate a portion of the organic layer that overlaps the first sub-pixel in a plan view from a portion of the organic layer that overlaps the second sub-pixel in a plan view.

The display device may further include a first capping layer disposed between the color conversion layer and the optical layer, and a second capping layer disposed between the optical layer and the organic layer.

The first capping layer or the second capping layer may be disposed on the first sub-pixel and on the second sub-pixel.

The display device may further include a central portion, and an outer portion surrounding the central portion. A height of the bank disposed in the central portion is less than a height of the bank disposed in the outer portion.

The display device may further include a first electrode electrically connected to first ends of the light emitting elements, and a second electrode electrically connected to second ends of the light emitting elements.

The display device may further include a color filter layer disposed on the organic layer.

The display device may further include an overcoat layer disposed on the color filter layer.

Details of other embodiments are included in the detailed description and drawings.

According to an embodiment of the disclosure, recess patterns may be formed in the optical layer and/or the organic layer, and thus shrinkage stress may be dispersed in case that the optical layer and/or the organic layer are deformed. Therefore, reliability of the display panel may be improved by minimizing warpage.

Effects according to embodiments are not limited by the contents above, and other effects may be included in the specification.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENTS

Figure 1:
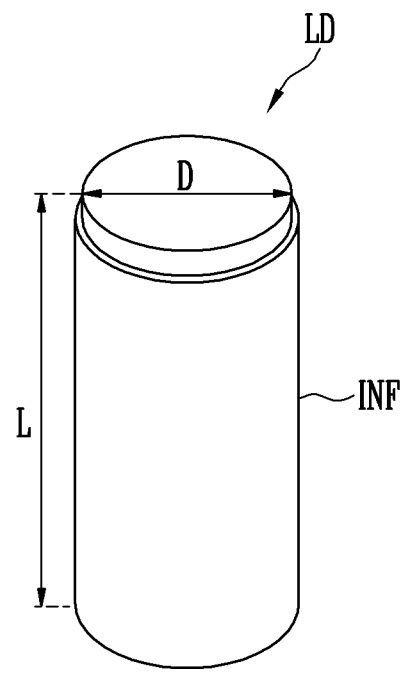
FIGS. 1 and 2 are schematic perspective and schematic cross-sectional views illustrating a light emitting element according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art. The disclosure is only defined by the scope of the claims.

The terms used in the specification are for describing embodiments and are not intended to limit the disclosure. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean "A, B, or A and B."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

The term "comprises" and/or "comprising" does not exclude presence or addition of one or more other components, steps, operations, and/or elements to the described component, step, operation, and/or element.

The term "coupling," or "connection" may collectively mean a physical and/or electrical coupling or connection. This may collectively mean a direct or indirect coupling or connection and an integral or non-integral coupling or connection.

A case in which an element or a layer is referred to as "on" another element or layer includes a case in which another layer or another element is disposed directly on the other element or between the other layers. The same reference numerals denote to the same components throughout the specification.

Although a first, a second, and the like are used to describe various components, these components are not limited by these terms. These terms are used only to distinguish one component from another component. Therefore, a first component described below may be a second component within the technical spirit of the disclosure.

Hereinafter, embodiments of the disclosure are described in detail with reference to the accompanying drawings.

Figure 2:
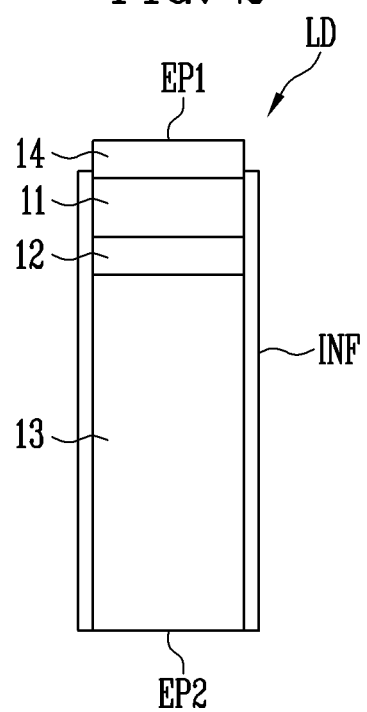

FIGS. 1 and 2 are schematic perspective and schematic cross-sectional views illustrating a light emitting element according to an embodiment. FIGS. 1 and 2 show a column shape light emitting element LD, but a type and/or a shape of the light emitting element LD not limited thereto.

Referring to FIGS. 1 and 2, the light emitting element LD may include a first semiconductor layer 11, an active layer 12, a second semiconductor layer 13, and/or an electrode layer 14.

The light emitting element LD may be formed in a column shape extending in a direction. The light emitting element LD may have a first end EP1 and a second end EP2. One of the first and second semiconductor layers 11 and 13 may be disposed at the first end EP1 of the light emitting element LD. The other of the first and second semiconductor layers 11 and 13 may be disposed at the second end EP2 of the light emitting element LD. For example, the first semiconductor layer 11 may be disposed at the first end EP1 of the light emitting element LD, and the second semiconductor layer 13 may be disposed at the second end EP2 of the light emitting element LD.

According to an embodiment, a light emitting element LD may be a light emitting element manufactured in a column shape through an etching method or the like. In the specification, the column shape may include a rod shape or a bar shape of which an aspect ratio is greater than 1, such as a circular column or a polygonal column, and the shape of the cross-section thereof is not limited.

The light emitting element LD may have a size as small as a nanometer scale to a micrometer scale. For example, each light emitting element LD may have a diameter D (or width) and/or a length L of a nanometer scale to micrometer scale range. However, a size of the light emitting element LD is not limited thereto, and the size of the light emitting element LD may vary according to a design condition of devices using the light emitting device using the light emitting element LD as a light source, for example, a display device or the like.

The first semiconductor layer 11 may be a semiconductor layer of a first conductivity type. For example, the first semiconductor layer 11 may include a p-type semiconductor layer. For example, the first semiconductor layer 11 may include at least one semiconductor material among InAlGaN, GaN, AlGaN, InGaN, or AlN, and may include a p-type semiconductor layer doped with a first conductivity type dopant such as Mg. However, the material of the first semiconductor layer 11 is not limited thereto, and other materials may be used in the first semiconductor layer 11.

The active layer 12 may be disposed between the first semiconductor layer 11 and the second semiconductor layer 13. The active layer 12 may have any of a single well structure, a multi well structure, a single quantum well structure, a multi quantum well (MQW) structure, a quantum dot structure, or a quantum wire structure, but the embodiments are not limited thereto. The active layer 12 may include GaN, InGaN, InAlGaN, AlGaN, or AlN, and other materials may be used in the active layer 12.

When a voltage equal to or greater than a threshold voltage is applied to both ends of the light emitting element LD, an electron-hole pair is combined in the active layer 12 and thus the light emitting element LD emits light. By controlling the emission of the light emitting element LD using such a principle, the light emitting element LD may be used as a light source in light emitting devices including a pixel of a display device.

The second semiconductor layer 13 may be disposed on the active layer 12 and may include a semiconductor layer of a type different from that of the first semiconductor layer 11. The second semiconductor layer 13 may include an n-type semiconductor layer. For example, the second semiconductor layer 13 may include any one semiconductor material among InAlGaN, GaN, AlGaN, InGaN, and AlN, and may include an n-type semiconductor layer doped with a second conductivity type dopant such as phosphorus Si, Ge, and Sn. However, the material used in the second semiconductor layer 13 is not limited thereto, and the second semiconductor layer 13 may include other materials.

The electrode layer 14 may be disposed on the first end EP1 and/or the second end EP2 of the light emitting element LD. FIG. 2 illustrates a case in which the electrode layer 14 is formed on the first semiconductor layer 11, but the disclosure is not limited thereto. For example, a separate contact electrode may be further disposed on the second semiconductor layer 13.

The electrode layer 14 may include a transparent metal or a transparent metal oxide. For example, the electrode layer 14 may include at least one of indium tin oxide (ITO), indium zinc oxide (IZO), and zinc tin oxide (ZTO), but the embodiments are not limited thereto. As described above, when the electrode layer 14 is formed of the transparent metal or the transparent metal oxide, light generated in the active layer 12 of the light emitting element LD may pass through the electrode layer 14 and may be emitted to the outside of the light emitting element LD.

An insulating layer INF may be provided on a surface of the light emitting element LD. The insulating film INF may be directly disposed on a surface of the first semiconductor layer 11, the active layer 12, the second semiconductor layer 13, and/or the electrode layer 14. The insulating film INF may expose the first and second ends EP1 and EP2 of the light emitting element LD having different polarities. According to an embodiment, the insulating film INF may expose a side portion of the electrode layer 14 and/or the second semiconductor layer 13 adjacent to the first and second ends EP1 and EP2 of the light emitting element LD.

The insulating layer INF may prevent an electrical short that may occur when the active layer 12 comes into contact with a conductive material except for the first and second semiconductor layers 11 and 13. The insulating layer INF may minimize surface defects of the light emitting elements LD, thereby improving lifespan and emission efficiency of the light emitting elements LD.

The insulating film INF may include at least one of silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and titanium oxide (TiOx). For example, the insulating film INF may be configured as a double layer, and each layer of the double layer may include different materials. For example, the insulating film INF may be configured as a double layer including aluminum oxide (AlOx) and silicon oxide (SiOx), but the embodiments are not limited thereto. According to an embodiment, the insulating film INF may be omitted.

A light emitting device including the light emitting element LD described above may be used in a variety of devices that require a light source, including a display device. For example, light emitting elements LD may be disposed in each pixel of a display panel, and the light emitting elements LD may be used as a light source of each pixel. However, application fields of the light emitting element LD are not limited to the above-described example. For example, the light emitting element LD may also be used in other types of devices that require a light source, such as a lighting device.

Figure 3:
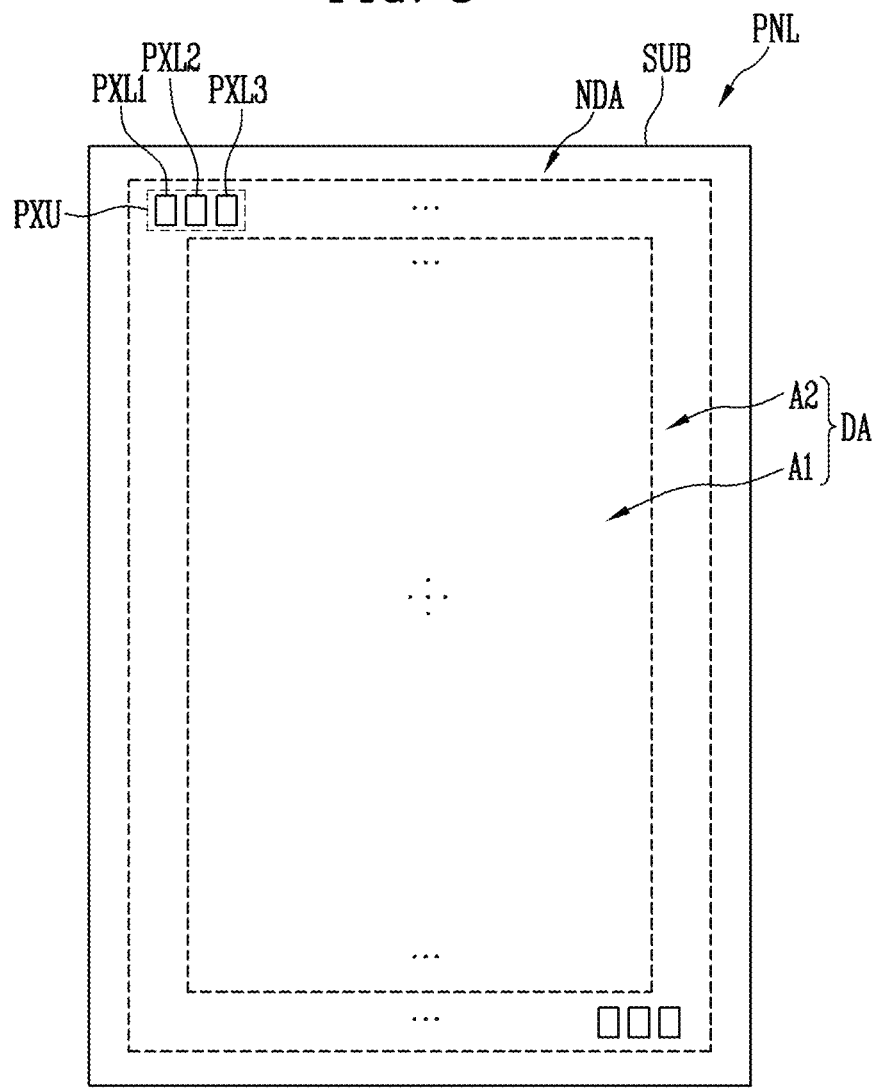
FIG. 3 is a schematic plan view illustrating a display device according to an embodiment.
Figure 4:
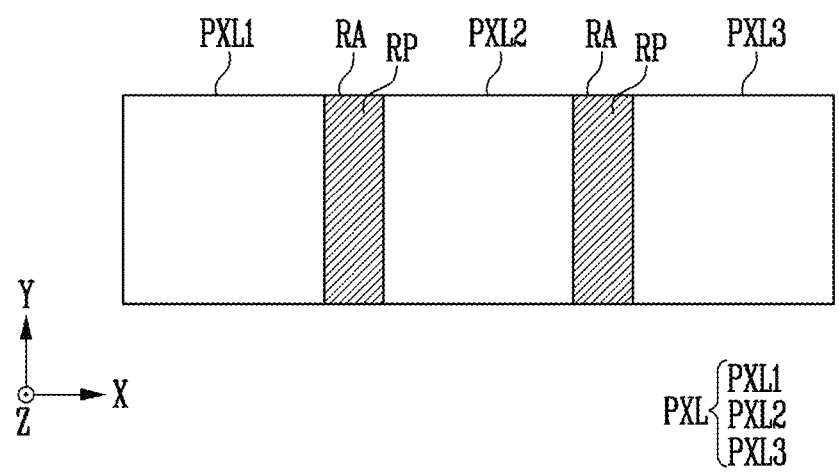
FIGS. 4 to 6 are schematic plan views illustrating sub-pixels according to an embodiment.
Figure 5:
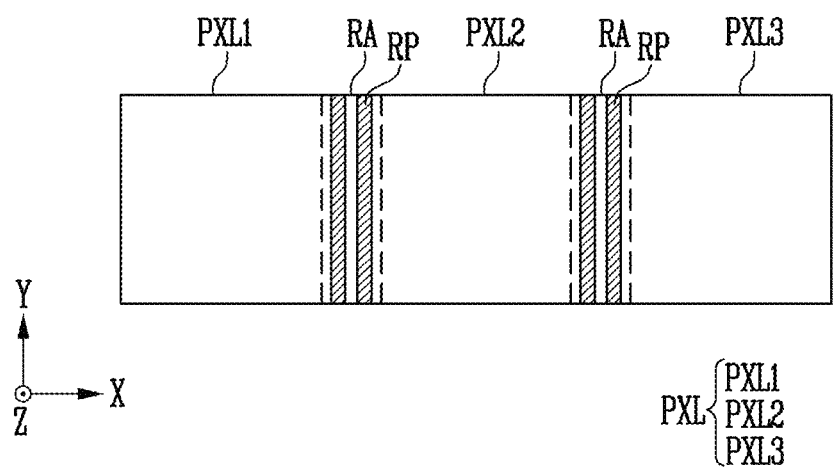
Figure 6:
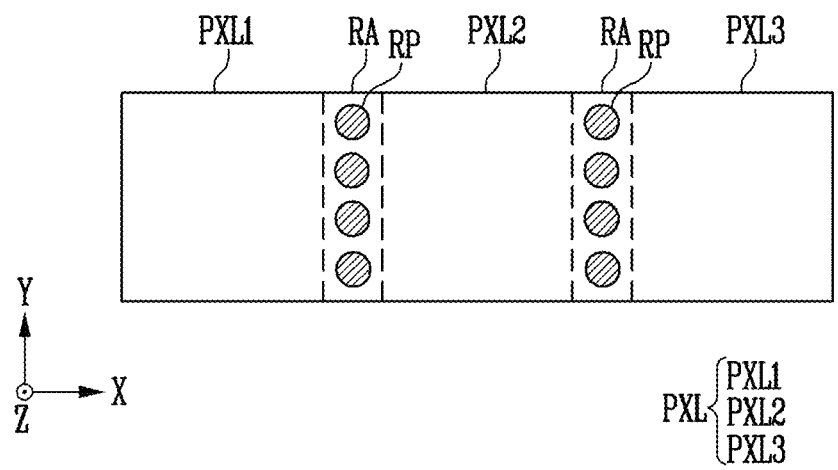

FIG. 3 is a schematic plan view illustrating a display device according to an embodiment. FIGS. 4 to 6 are schematic plan views illustrating sub-pixels according to an embodiment.

In FIG. 3, as an example of an electronic device that may use the light emitting element LD described in the embodiments of FIGS. 1 and 2 as a light source, a display panel PNL provided in a display device is shown.

Each pixel unit PXU of the display panel PNL and each sub-pixel PXL of the pixel unit PXU may include at least one light emitting element LD. For convenience of description, in FIG. 3, a structure of the display panel PNL is briefly shown based on a display area DA. However, according to an embodiment, at least one driving circuit unit (for example, at least one of a scan driver and a data driver), lines, and/or pads, which are/is not shown, may be further disposed on the display panel PNL.

Referring to FIG. 3, the display panel PNL may include a substrate SUB and a pixel unit PXU disposed on the substrate SUB. The pixel unit PXU may include first sub-pixels PXL1, second sub-pixels PXL2, and/or third sub-pixel PXL3. Hereinafter, when at least one sub-pixel among the first sub-pixels PXL1, the second sub-pixels PXL2, and the third sub-pixels PXL3 is arbitrarily referred to, or when two or more types of sub-pixels are collectively referred to, the at least one sub-pixel or the two or more types of sub-pixels is referred to as a "sub-pixel PXL" or "sub-pixels PXL".

The substrate SUB may comprise a base member of the display panel PNL, and may be a rigid or flexible substrate or film. For example, the substrate SUB may be formed of a rigid substrate formed of glass or tempered glass, or a flexible substrate (or thin film) of plastic or metal, and a material and/or physical properties of the substrate SUB are not particularly limited.

The display panel PNL and the substrate SUB for forming the same may include a display area DA for displaying an image and a non-display area NDA except for the display area DA. The sub-pixels PXL may be disposed in the display area DA. Lines, pads, and/or built-in circuits connected to the sub-pixels PXL of the display area NDA may be disposed in the non-display area NDA. The sub-pixels PXL may be regularly arranged according to a stripe or PENTILE™ arrangement structure, or the like. However, the arrangement structure of the sub-pixels PXL is not limited thereto, and the sub-pixels PXL may be arranged in the display area DA in other structures and/or methods.

According to an embodiment, two or more types of sub-pixels PXL emitting light of different colors may be disposed in the display area DA. For example, in the display area DA, the first sub-pixels PXL1 emitting light of a first color, the second sub-pixels PXL2 emitting light of a second color, and the third sub-pixel PXL3 emitting light of a third color may be arranged. At least one of the first to third sub-pixels PXL1, PXL2, and PXL3 arranged to be adjacent to each other may comprise a pixel unit PXU capable of emitting light in a variety of colors. For example, each of the first to third sub-pixels PXL1, PXL2, and PXL3 may be a sub-pixel emitting light of a selected color. According to an embodiment, the first sub-pixel PXL1 may be a red pixel emitting red light, the second sub-pixel PXL2 may be a green pixel emitting green light, and the third sub-pixel PXL3 may be a blue pixel emitting blue light, but are not limited thereto.

In an embodiment, the first sub-pixel PXL1, the second sub-pixel PXL2, and the third sub-pixel PXL3 may include light emitting elements that emit light of the same color, and may include a color conversion layer and/or a color filter of different colors disposed on the respective light emitting element, to emit light of the first color, the second color, and the third color, respectively. In other examples, the first sub-pixel PXL1, the second sub-pixel PXL2, and the third sub-pixel PXL3 may include a light emitting element of the first color, a light emitting element of the second color, and a light emitting element of the third color as a light source, to emit light of the first color, the second color, and the third color, respectively. However, the color, type, number, and/or the like of sub-pixels PXL comprising each pixel unit PXU are not limited. The color of light emitted by each sub-pixel PXL may be changed.

The sub-pixel PXL may include at least one light source driven by a selected control signal (for example, a scan signal and a data signal) and/or selected power (for example, first power and second power). In an embodiment, the light source may include at least one light emitting element LD according to any one of the embodiments of FIGS. 1 and 2, such as, an ultra-small column shape light emitting elements LD having a size in a range of nanometers to micrometers. However, the disclosure is not limited thereto, and other types of light emitting elements LD may be used as the light source of the sub-pixel PXL.

In an embodiment, each sub-pixel PXL may be configured as an active pixel. However, the type, structure, and/or driving methods of the sub-pixels PXL applicable to the display device are not limited. For example, each sub-pixel PXL may be configured as a pixel of a passive or active light emitting display device of using other types if structures driving methods.

The display area DA may include a first area A1 and a second area A2.

The first area A1 may correspond to a central portion, and the second area A2 may correspond to an outer portion surrounding the central portion. For example, the second area A2 may correspond to an area spaced apart from an edge of the display area DA by about 40 mm to about 50 mm.

As organic layers comprising the display panel PNL are repeatedly stacked and cured, warpage may occur, and thus the reliability of the display panel PNL may be reduced. Such warpage may increase in the second area A2 corresponding to the outer portion compared to the first area A1 which is the central portion. Accordingly, in the display device according to the embodiment, a recess portion RA may be formed between the sub-pixels PXL in order to disperse shrinkage stress generated in a process in which organic layers comprising the display panel PNL are deformed as organic layers are repeatedly stacked and cured. FIGS. 4 to 6 provide a detailed description of the recess portion RA.

The recess portion RA may be disposed between the first to third sub-pixels PXL1, PXL2, and PXL3. The recess portion RA may include at least one recess pattern RP. For example, as shown in FIG. 4, the recess pattern RP may have a bar or slit shape extending along a second direction (Y-axis direction). As shown in FIG. 5, there may be multiple recess patterns RP. The recess patterns RP may have a circular shape as shown in FIG. 6. However, the shape of the recess patterns RP is not limited thereto, and may be changed within a range capable of dispersing the shrinkage stress of the organic layer.

In an embodiment, the number of the recess patterns RP per unit area of the first area A1 may be different from the number of the recess patterns RP per unit area of the second area A2. For example, the number of the recess patterns RP per unit area of the first area A1 may be less than the number of the recess patterns RP per unit area of the second area A2. For example, FIG. 4 may correspond to first area A1 and FIG. 5 may correspond to second area A2. As described above, when a large number of the recess patterns RP are formed in the second area A2 corresponding to the outer portion, since shrinkage stress of the second area A2 may be dispersed, the warpage phenomenon may be minimized. According to an embodiment, the number of recess patterns RP per unit area of the second area A2 may increase from a point adjacent to the first area A1 to an edge of the display area DA. Accordingly, the shrinkage stress that increases toward the edge of the display area DA may be dispersed.

A depth of the recess patterns RP of the first area A1 may be different from a depth of the recess patterns RP of the second area A2. For example, the depth of the recess patterns RP of the first area A1 may be less than the depth of the recess patterns RP of the second area A2. As described above, when the recess patterns RP are deeply formed in the second area A2 corresponding to the outer portion, since the shrinkage stress of the second area A2 may be dispersed, the warpage phenomenon may be minimized. According to an embodiment, the depth of the recess patterns RP of the second area A2 may increase from the point adjacent to the first area A1 to the edge of the display area DA. Accordingly, the shrinkage stress that increases toward the edge of the display area DA may be more dispersed.

Figure 7:
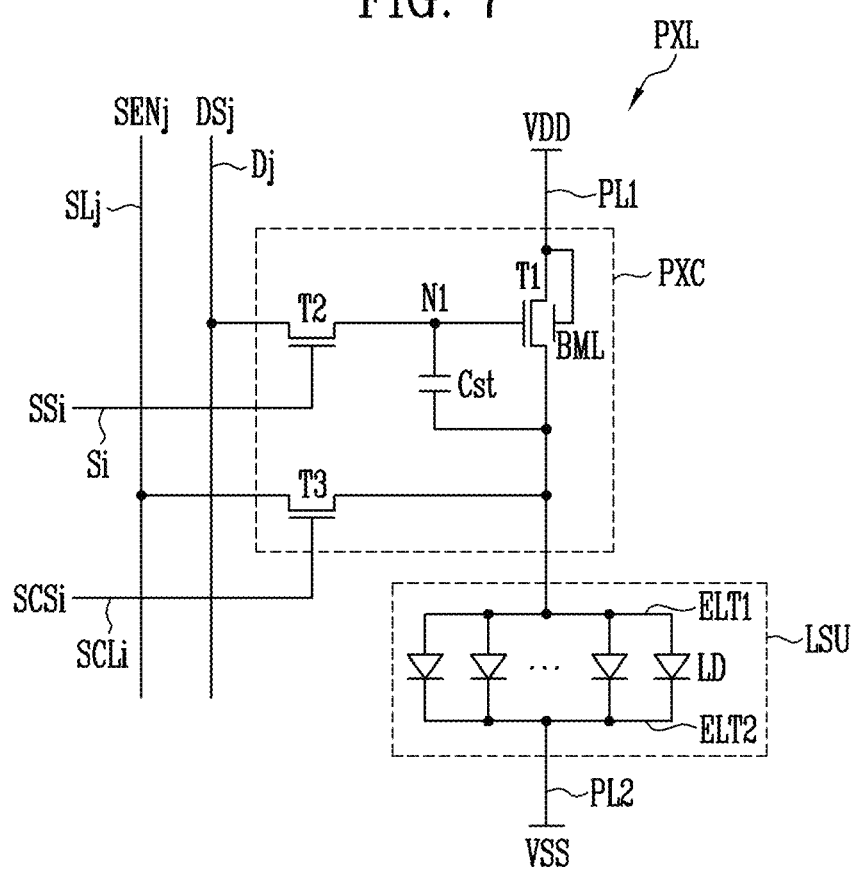
FIG. 7 is a schematic diagram of an equivalent circuit illustrating a sub pixel according to an embodiment.

FIG. 7 is a schematic diagram of an equivalent circuit illustrating a sub pixel according to an embodiment.

Referring to FIG. 7, the sub sub-pixel PXL may include a light emitting unit LSU for generating light of a luminance corresponding to a data signal, and a pixel circuit PXC for driving the light emitting unit LSU.

The light emitting unit LSU may include at least one light emitting element LD connected between the first power VDD and the second power VSS. For example, the light emitting unit LSU may include a first electrode ELT1 connected to the first power VDD through the pixel circuit PXC and a first power line PL1, a second electrode ELT2 connected to the second power VSS through a second power line PL2, and light emitting elements LD electrically connected between the first and second electrodes ELT1 and ELT2. In an embodiment, the first electrode ELT1 may be an anode electrode, and the second electrode ELT2 may be a cathode electrode.

Each of the light emitting elements LD may include the first end EP1 electrically connected to the first power VDD through the first electrode ELT1 and/or the pixel circuit PXC, and the second end EP2 electrically connected to the second power VSS through the second electrode ELT2. For example, the light emitting elements LD may be connected in a forward direction between the first and second electrodes ELT1 and ELT2. Each light emitting element LD electrically connected in the forward direction between the first power VDD and the second power VSS may comprise a respective effective light source, and a collection of effective light sources may comprise the light emitting unit LSU of the sub-pixel PXL.

The first power VDD and the second power VSS may have different potentials so that the light emitting elements LD may emit light. For example, the first power VDD may be set as a high potential power, and the second power VSS may be set as a low potential power. A potential difference between the first power VDD and the second power VSS may be set to be greater than or equal to a threshold voltage of the light emitting elements LD during at least the emission period of the sub-pixel PXL.

An end of the light emitting elements LD comprising each light emitting unit LSU may be commonly connected to the pixel circuit PXC through an electrode (for example, the first electrode ELT1 of each sub-pixel PXL) of the light emitting unit LSU, and may be electrically connected to the first power VDD through the pixel circuit PXC and the first power line PL1. Another end of the light emitting elements LD may be commonly connected to the second power VSS through another electrode (for example, the second electrode ELT2 of each sub-pixel PXL) of the light emitting unit LSU and the second power line PL2.

The light emitting elements LD may emit light with a luminance corresponding to a driving current supplied through the corresponding pixel circuit PXC. For example, during each frame period, the pixel circuit PXC may supply the driving current corresponding to a grayscale value to be expressed in a corresponding frame to the light emitting unit LSU. The driving current supplied to the light emitting unit LSU may be divided and may flow through the light emitting elements LD electrically connected in the forward direction. Accordingly, the light emitting unit LSU may emit light of the luminance corresponding to the driving current while each light emitting element LD emits light with a luminance corresponding to a current flowing therein.

The pixel circuit PXC may be electrically connected between the first power VDD and the first electrode ELT1. The pixel circuit PXC may be electrically connected to a scan line Si and a data line Dj of a corresponding sub-pixel PXL. For example, when the sub-pixel PXL is disposed on an i-th (i is a natural number) horizontal line (row) and a j-th (j is a natural number) vertical line (column) of the display area DA, the pixel circuit PXC may be connected to the i-th scan line Si and the j-th data line Dj of the display area DA.

According to an embodiment, the pixel circuit PXC may include transistors T1, T2, and T3 and at least one storage capacitor Cst.

The first transistor T1 may be electrically connected between the first power VDD and the light emitting unit LSU. For example, a first electrode (for example, a drain electrode) of the first transistor T1 may be electrically connected to the first power VDD, and a second electrode (for example, a source electrode) of the first transistor T1 may be electrically connected to the first electrode ELT1. A gate electrode of the first transistor T1 may be electrically connected to a first node N1. The first transistor T1 may control the driving current supplied to the light emitting unit LSU in response to a voltage of the first node N1. For example, the first transistor T1 may be a driving transistor that controls the driving current of the sub-pixel PXL.

In an embodiment, the first transistor T1 may further include a lower conductive layer BML (also referred to as a "lower electrode", a "back gate electrode", or a "lower light blocking layer"). The gate electrode of the first transistor T1 and the lower conductive layer BML may overlap each other, and an insulating layer may be interposed between them. The lower conductive layer BML may be electrically connected to an electrode of the first transistor T1, for example, the source electrode or the drain electrode.

In case that the first transistor T1 includes the lower conductive layer BML, when the sub-pixel PXL is driven, a back-biasing technique (or sync technique) that moves a threshold voltage of the transistor T1 in a negative direction or a positive direction by applying a back-biasing voltage to the lower conductive layer BML of the first transistor T1 may be applied. For example, the threshold voltage of the first transistor T1 may be moved in the negative direction or the positive direction, by applying a source-sink technique by electrically connecting the lower conductive layer BML to the source electrode of the first transistor T1. When the lower conductive layer BML is disposed under a semiconductor pattern comprising a channel of the first transistor T1, the lower conductive layer BML may serve as a light blocking pattern and may stabilize an operation characteristic of the first transistor T1. However, the function and/or utilization method of the lower conductive layer BML is not limited thereto.

The second transistor T2 may be electrically connected between the data line Dj and the first node N1. For example, a first electrode of the second transistor T2 may be electrically connected to the data line Dj, and a second electrode of the second transistor T2 may be electrically connected to the first node N1. A gate electrode of the second transistor T2 may be electrically connected to the scan line Si. The second transistor T2 may be turned on when a scan signal SSi of a gate-on voltage (for example, a high level voltage) is supplied from the scan line Si, to electrically connect the data line Dj and the first node N1.

In each frame period, a data signal DSj of the corresponding frame may be supplied to the data line Dj, and the data signal DSj may be transferred to the first node N1 through the second transistor T2 turned on during a period in which the scan signal SSi of the gate-on voltage is supplied. For example, the second transistor T2 may be a switching transistor for transferring each data signal DSj to an inside of the sub-pixel PXL.

The third transistor T3 may be electrically connected between the first transistor T1 and a sensing line SLj. For example, an electrode of the third transistor T3 may be electrically connected to the second electrode (for example, the source electrode) of the first transistor T1 electrically connected to the first electrode ELT1, and another electrode of the third transistor T3 may be electrically connected to the sensing line SLj. In case that the sensing line SLj is omitted, the other electrode of the third transistor T3 may be electrically connected to the data line Dj.

A gate electrode of the third transistor T3 may be electrically connected to a sensing control line SCLi. In case that the sensing control line SCLi is omitted, the gate electrode of the third transistor T3 may be electrically connected to the scan line Si. The third transistor T3 may be turned on by a sensing control signal SCSI of a gate-on voltage (for example, a high level voltage) supplied to the sensing control line SCLi during a sensing period, to electrically connect the sensing line SLj and the first transistor T1.

According to an embodiment, a sensing period may be a period in which a characteristic (for example, a threshold voltage or the like of the first transistor T1) of each of the sub-pixels PXL disposed in the display area DA is extracted. During the sensing period, the first transistor may be turned on by supplying a reference voltage, at which the first transistor T1 may be turned on, to the first node N1 through the data line Dj and the second transistor T2, or electrically connecting each sub-pixel PXL to a current source or the like. The third transistor T3 may be turned on by supplying the sensing control signal SCSI of the gate-on voltage to the third transistor T3, to electrically connect the first transistor T1 to the sensing line SLj. A sensing signal SENj may be obtained through the sensing line SLj, and the characteristic of each sub-pixel PXL including the threshold voltage or the like of the first transistor T1 may be detected using the sensing signal SENj. Information on the characteristic of each sub-pixel PXL may be used to convert image data so that a characteristic deviation between the sub-pixels PXL disposed in the display area DA may be compensated.

An electrode of the storage capacitor Cst may be electrically connected to the second electrode of the first transistor T1, and another electrode may be electrically connected to the first node N1. The storage capacitor Cst may charge a voltage corresponding to the data signal DSj supplied to the first node N1 during each frame period.

FIG. 7 shows an embodiment in which all of the effective light sources, the light emitting elements LD, comprising each light emitting unit LSU, are connected in parallel, but the disclosure is not limited thereto. For example, the light emitting unit LSU of each sub-pixel PXL may include at least two stages of series structures. The light emitting elements comprising each series stage may be connected in series with each other by at least one intermediate electrode.

In FIG. 7, all transistors included in the pixel circuit PXC are n-type transistors, but the disclosure is not limited thereto. For example, at least one of the first to third transistors T1, T2, and T3 may be changed to a p-type transistor.

The structure and a driving method of the sub-pixel PXL may be changed. For example, the pixel circuit PXC may be comprised of other structures and/or driving methods in addition to those shown in FIG. 7.

Figure 8:
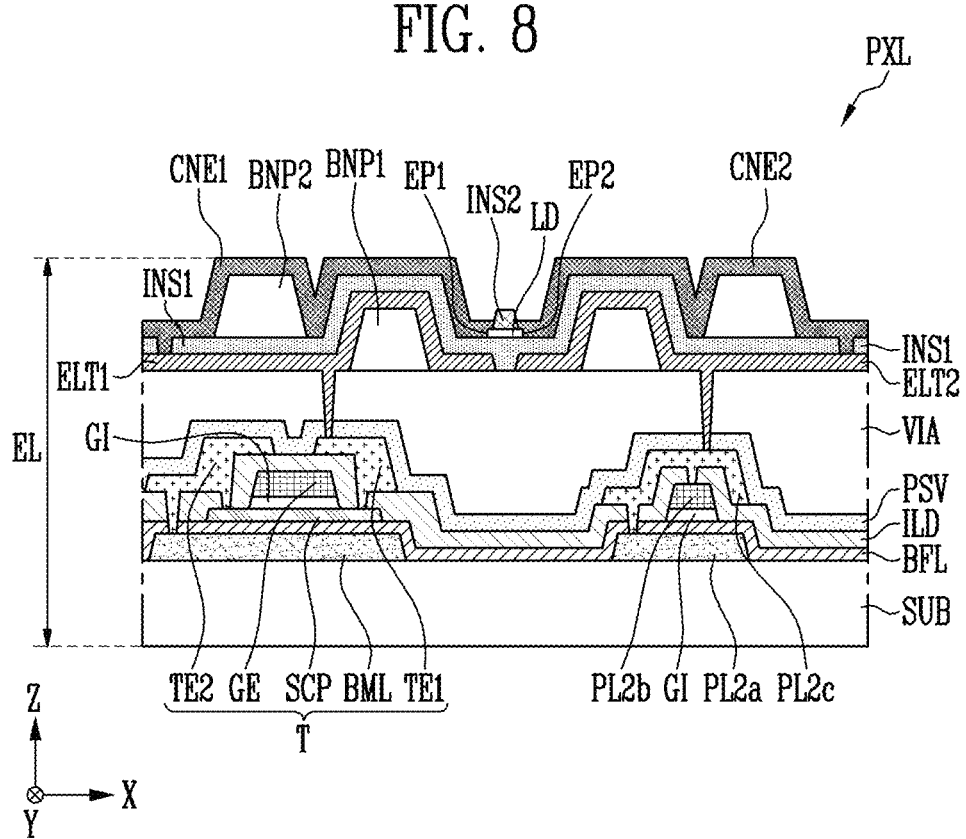
FIGS. 8 and 9 are schematic cross-sectional views illustrating a sub-pixel according to an embodiment.
Figure 9:
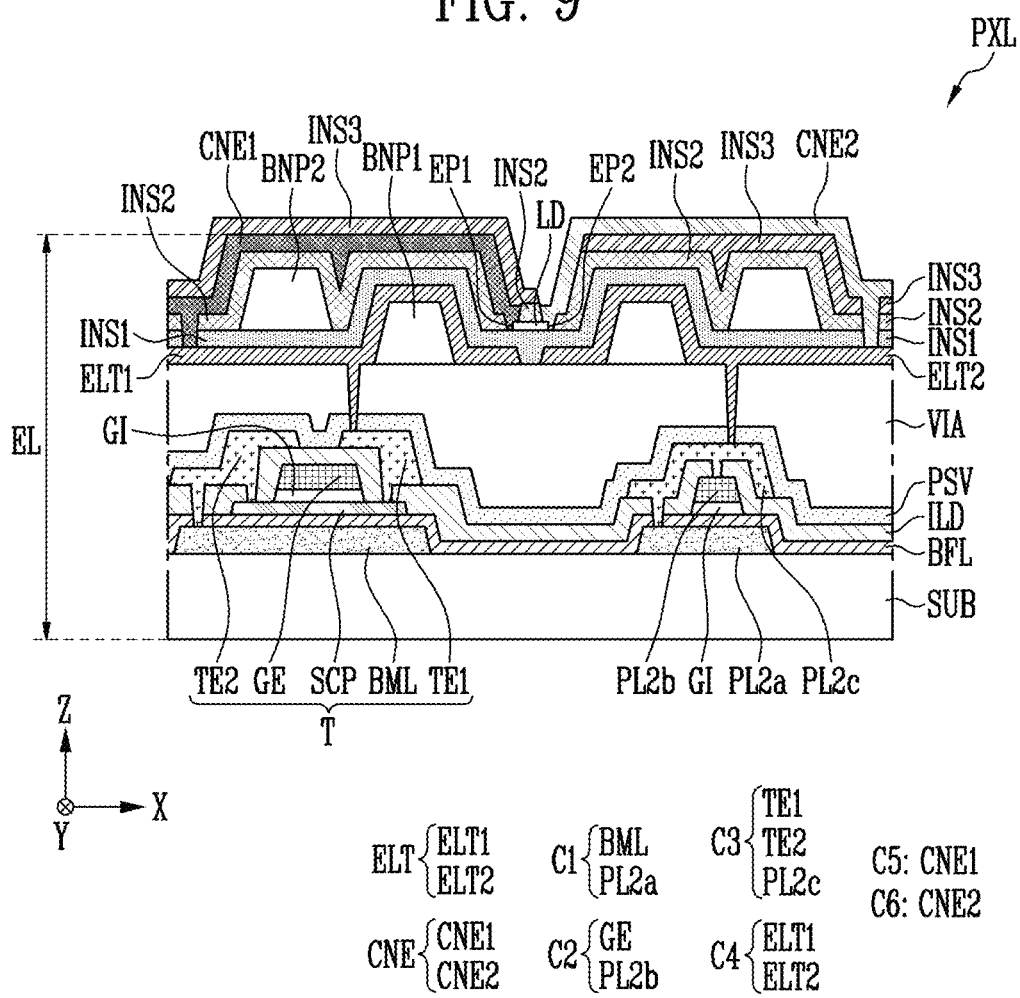

FIGS. 8 and 9 are schematic cross-sectional views illustrating a sub-pixel according to an embodiment.

FIGS. 8 and 9 illustrate a light emitting element layer EL of the sub-pixel PXL. In FIGS. 8 and 9, the first transistor T1 among the circuit elements comprising the pixel circuit PXC of FIG. 7 is illustrated. When the first to third transistor T1, T2, and T3 are not separately specified, the first to third transistors T1, T2, and T3 may be collectively referred to as a "transistor T" or "transistors T." The structure, position of each layer, and/or the like of the transistors T are not limited to the embodiment shown in FIGS. 8 and 9, and may be changed in other embodiments.

Referring to FIGS. 8 and 9, the light emitting element layer EL of the sub-pixels PXL according to an embodiment may include circuit elements including transistors T disposed on the substrate SUB, and lines electrically connected to the circuit elements. The first and second electrodes ELT1 and ELT2 (also referred to as "alignment electrodes") of light emitting unit LSU, the light emitting elements LD, and/or first and second connection electrodes CNE1 and CNE2 may be disposed on the circuit elements. Hereinafter, the first and second electrodes ELT1 and ELT2 may be collectively referred to as "electrodes ELT." Any of the individual electrodes may be singly referred to as an "electrode ELT," depending on the context. Similarly, the first and second connection electrodes CNE1 and CNE2 may be collectively referred to as "connection electrodes CNE." Any of the individual connection electrodes may be singly referred to as a "connection electrode CNE."

The substrate SUB may comprise a base member, and may be a rigid or flexible substrate or film. For example, the substrate SUB may be a rigid substrate formed of glass or tempered glass, a flexible substrate (or a thin film) formed of a plastic or metal material, or an insulating layer of at least one layer. The material and/or physical properties of the substrate SUB are not particularly limited. In an embodiment, the substrate SUB may be substantially transparent. Here, "substantially transparent" may mean that light may be transmitted at a selected transmittance or more. In other embodiments, the substrate SUB may be translucent or opaque. The substrate SUB may include a reflective material according to other embodiments.

A first conductive layer C1 may be disposed on the substrate SUB. The first conductive layer C1 may include the lower conductive layer BML of the transistor T and a first power conductive layer PL2a. The lower conductive layer BML and the first power conductive layer PL2a may be disposed on the same layer. For example, the lower conductive layer BML and the first power conductive layer PL2a may be simultaneously formed in the same process, but are not limited thereto. The first power conductive layer PL2a may comprise the second power line PL2 described with reference to FIG. 7 and the like.

The first conductive layer C1 may be configured as a single layer or multiple layers formed of at least one of molybdenum (Mo), copper (Cu), aluminum (Al), chromium (Cr), gold (Au), titanium (Ti), nickel (Ni), neodymium (Nd), and indium tin oxide (ITO), or an alloy thereof.

A buffer layer BFL may be disposed on the first conductive layer C1. The buffer layer BFL may prevent an impurity from being diffused into the circuit element. The buffer layer BFL may be configured as a single layer, but may be configured as multiple layers of at least two or more layers. When the buffer layer BFL is formed of multiple layers, each layer may be formed of the same material or may be formed of different materials.

The semiconductor pattern SCP may be disposed on the buffer layer BFL. For example, each semiconductor pattern SCP may include a first region that is in electrical contact with the first transistor electrode TE1, a second region that is in electrical contact with the second transistor electrode TE2, and a channel region positioned between the first and second regions. According to an embodiment, one of the first and second regions may be a source region and the other may be a drain region.

According to an embodiment, the semiconductor pattern SCP may be formed of polysilicon, amorphous silicon, oxide semiconductor, or the like. The channel region of the semiconductor pattern SCP may be an intrinsic semiconductor as a semiconductor pattern which is not doped with an impurity. Each of the first and second regions of the semiconductor pattern SCP may be a semiconductor doped with an impurity.

A gate insulating layer GI may be disposed on the buffer layer BFL and the semiconductor pattern SCP. For example, the gate insulating layer GI may be disposed between the semiconductor pattern SCP and the gate electrode GE. The gate insulating layer GI may be disposed between the buffer layer BFL and the second power conductive layer PL2b. The gate insulating layer GI may be configured as a single layer or multiple layers, and may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A second conductive layer C2 may be disposed on the gate insulating layer GI. The second conductive layer C2 may include the gate electrode GE of the transistor T and a second power conductive layer PL2b. The gate electrode GE and the second power conductive layer PL2b may be disposed on the same layer. For example, the gate electrode GE and the second power conductive layer PL2b may be simultaneously formed in the same process, but are not limited thereto. The gate electrode GE may overlap the semiconductor pattern SCP in a third direction (Z-axis direction) on the gate insulating layer GI. The second power conductive layer PL2b may overlap the first power conductive layer PL2a in the third direction (Z-axis direction) on the gate insulating layer GI. The second power conductive layer PL2b may comprise the second power line PL2 described in FIG. 7 and the like together with the first power conductive layer PL2a.

The second conductive layer C2 may be configured as a single layer or multiple layers formed of at least one of titanium (Ti), copper (Cu), indium tin oxide (ITO), molybdenum (Mo), chromium (Cr), gold (Au), nickel (Ni), and neodymium (Nd), or an alloy thereof. For example, the second conductive layer C2 may be formed as multiple layers in which titanium (Ti), copper (Cu), and/or indium tin oxide (ITO) are sequentially or repeatedly stacked.

An interlayer insulating layer ILD may be disposed on the second conductive layer C2. For example, the interlayer insulating layer ILD may be disposed between the gate electrode GE and the first and second transistor electrodes TE1 and TE2. The interlayer insulating layer ILD may be disposed between the second power conductive layer PL2b and a third power conductive layer PL2c.

The interlayer insulating layer ILD may be configured as a single layer or multiple layers, and may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A third conductive layer C3 may be disposed on the interlayer insulating layer ILD. The third conductive layer C3 may include the first and second transistor electrodes TE1 and TE2 of the transistor T and the third power conductive layer PL2c. The first and second transistor electrodes TE1 and TE2 and the third power conductive layer PL2c may be disposed on the same layer. For example, the first and second transistor electrodes TE1 and TE2 and the third power conductive layer PL2c may be simultaneously formed in the same process, but are not limited thereto.

The first and second transistor electrodes TE1 and TE2 may be disposed on the interlayer insulating layer ILD. The first and second transistor electrodes TE1 and TE2 may be disposed to overlap the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole passing through the interlayer insulating layer ILD. The second transistor electrode TE2 may be electrically connected to the second region of the semiconductor pattern SCP through a contact hole passing through the interlayer insulating layer ILD. The second transistor electrode TE2 may be electrically connected to the lower conductive layer BML through a contact hole passing through the interlayer insulating layer ILD and the buffer layer BFL. According to an embodiment, one of the first and second transistor electrodes TE1 and TE2 may be a source electrode, and the other may be a drain electrode.

The third power conductive layer PL2c may overlap the first power conductive layer PL2a and/or the second power conductive layer PL2b in the third direction (Z-axis direction). The third power conductive layer PL2c may be electrically connected to the first power conductive layer PL2a and/or the second power conductive layer PL2b. For example, the third power conductive layer PL2c may be electrically connected to the first power conductive layer PL2a through a contact hole passing through the interlayer insulating layer ILD and the buffer layer BFL. The third power conductive layer PL2c may be electrically connected to the second power conductive layer PL2b through a contact hole passing through the interlayer insulating layer ILD. The third power conductive layer PL2c may comprise the second power supply line PL2 together with the first power conductive layer PL2a and/or the second power conductive layer PL2b described in FIG. 7 and the like.

The third conductive layer C3 may be configured as a single layer or multiple layers formed of at least one of aluminum (Al), molybdenum (Mo), chromium (Cr), gold (Au), titanium (Ti), nickel (Ni), neodymium (Nd), and indium tin oxide (ITO), or an alloy thereof.

A protective layer PSV may be disposed on the third conductive layer C3. The protective layer PSV may be configured as a single layer or multiple layers, and may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A via layer VIA may be disposed on the protective layer PSV. The via layer VIA may be formed of an organic material to flatten a lower step difference. For example, the via layer VIA may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the via layer VIA may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

First bank patterns BNP1 may be disposed on the via layer VIA. The first bank patterns BNP1 may have a variety of shapes according to an embodiment. In an embodiment, the first bank patterns BNP1 may have a shape protruding in the third direction (Z-axis direction) on the substrate SUB. The first bank patterns BNP1 may have an inclined surface inclined at a selected angle with respect to the substrate SUB. However, the disclosure is not limited thereto, and the first bank patterns BNP1 may have a sidewall of a curved surface, a step shape, or the like. For example, the first bank patterns BNP1 may have a cross section of a semicircle shape, a semi-ellipse shape, or the like.

Electrodes and insulating layers disposed on the first bank patterns BNP1 may have a shape corresponding to the first bank patterns BNP1. For example, the first and second electrodes ELT1 and ELT2 disposed on the first bank patterns BNP1 may include an inclined surface or a curved surface having a shape corresponding to the shape of the first bank patterns BNP1. Accordingly, the first bank patterns BNP1 may function as a reflective member that improves emission efficiency of the display panel PNL by guiding the light emitted from the light emitting elements LD in the front direction, for example, the third direction (Z-axis direction) of the sub pixel PXL together with the first and second electrodes ELT1 and ELT2 provided on the first bank patterns BNP1.

The first bank patterns BNP1 may include at least one organic material and/or inorganic material. For example, the first bank patterns BNP1 may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the first bank patterns BNP1 may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A fourth conductive layer C4 may be disposed on the via layer VIA and the first bank patterns BNP1. The fourth conductive layer C4 may include the first and second electrodes ELT1 and ELT2. The first and second electrodes ELT1 and ELT2 may be disposed to be spaced apart from each other in the sub-pixel PXL. The first and second electrodes ELT1 and ELT2 may be disposed on the same layer. For example, the first and second electrodes ELT1 and ELT2 may be simultaneously formed in the same process, but are not limited thereto.

The first electrode ELT1 may be electrically connected to the first transistor electrode TE1 of the transistor T through a contact hole passing through the via layer VIA and the protective layer PSV. The second electrode ELT2 may be electrically connected to the third power conductive layer PL2c through a contact hole passing through the via layer VIA and the protective layer PSV.

The first and second electrodes ELT1 and ELT2 may receive an alignment signal in an alignment step of the light emitting elements LD. Accordingly, an electric field may be formed between the first and second electrodes ELT1 and ELT2, and thus the light emitting elements LD supplied to each of the sub-pixels PXL may be aligned between the first and second electrodes ELT1 and ELT2.

The fourth conductive layer C4 may include at least one conductive material. For example, the fourth conductive layer C4 may include at least one metal including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an alloy including the metal, a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), or gallium tin oxide (GTO), and at least one conductive material among conductive polymers such as PEDOT, but the embodiments are not limited thereto.

A first insulating layer INS1 may be disposed on the fourth conductive layer C4. The first insulating layer INS1 may be configured as a single layer or multiple layers, and may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

A second bank pattern BNP2 may be disposed on the first insulating layer INS1. The second bank pattern BNP2 may form a dam structure that partitions an emission area to which the light emitting elements LD are to be supplied in a step of supplying the light emitting elements LD to each of the sub-pixels PXL. For example, a desired type and/or an amount of light emitting element ink may be supplied to the area partitioned by the second bank pattern BNP2.

The second bank pattern BNP2 may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the second bank pattern BNP2 may include inorganic materials such as silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

According to an embodiment, the second bank pattern BNP2 may include at least one light blocking and/or reflective material. Accordingly, light leakage between the adjacent sub-pixels PXL may be prevented. For example, the second bank pattern BNP2 may include at least one black matrix material, a color filter material, and/or the like. For example, the second bank pattern BNP2 may be formed as a black opaque pattern capable of blocking transmission of light. In an embodiment, a reflective layer or the like, which is not shown, may be formed on a surface (for example, a sidewall) of the second bank pattern BNP2 to increase light efficiency of each sub-pixel PXL.

The light emitting elements LD may be disposed on the first insulating layer INS1. The light emitting elements LD may be disposed between the first and second electrodes ELT1 and ELT2 on the first insulating layer INS1. The light emitting elements LD may be dispersed in a light emitting element ink, and may be supplied to each sub-pixel PXL through an inkjet printing method or the like. For example, the light emitting elements LD may be dispersed in a volatile solvent and provided to each of the sub-pixels PXL. Subsequently, when an alignment signal is supplied to the first and second electrodes ELT1 and ELT2, an electric field may be formed between the first and second electrodes ELT1 and ELT2, and thus the light emitting elements LD may be aligned between the first and second electrodes ELT1 and ELT2. After the light emitting elements LD are aligned, the solvent may be evaporated or removed by other methods to stably arrange the light emitting elements LD between the first and second electrodes ELT1 and ELT2.

A second insulating layer INS2 may be disposed on the first insulating layer INS1 and the light emitting elements LD. For example, the second insulating layer INS2 may be partially provided on the first insulating layer INS1 and the light emitting elements LD, and may expose the first and second ends EP1 and EP2 of the light emitting elements LD. When the second insulating layer INS2 is formed on the light emitting elements LD after the alignment of the light emitting elements LD is completed, the light emitting elements LD may be prevented from being separated from an aligned position. The first and second connection electrodes CNE1 and CNE2 to be described later may be stably separated by forming the second insulating layer INS2 on the light emitting elements LD.

The second insulating layer INS2 may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

The first and second connection electrodes CNE1 and CNE2 may be respectively disposed on the first and second ends EP1 and EP2 of the light emitting elements LD exposed by the second insulating layer INS2. The first connection electrode CNE1 may be directly disposed on the first end EP1 of the light emitting elements LD and may be in electrical contact with the first end EP1 of the light emitting elements LD. The second connection electrode CNE2 may be directly disposed on the second end EP2 of the light emitting elements LD and may be in electrical contact with the second end EP2 of the light emitting elements LD. The first connection electrode CNE1 may be electrically connected to the first electrode ELT1 through a contact hole passing through the second insulating layer INS2 and the first insulating layer INS1. The second connection electrode CNE2 may be electrically connected to the second electrode ELT2 through a contact hole passing through the second insulating layer INS2 and the first insulating layer INS1.

Referring to FIG. 8, the first and second connection electrodes CNE1 and CNE2 may be disposed on the same layer. For example, the first and second connection electrodes CNE1 and CNE2 may comprise a fifth conductive layer C5. The first and second connection electrodes CNE1 and CNE2 may be simultaneously formed in the same process, but are not limited thereto.

Referring to FIG. 9, the first and second connection electrodes CNE1 and CNE2 may be disposed on different layers. For example, the first connection electrode CNE1 may comprise a fifth conductive layer C5, and the second connection electrode CNE2 may comprise a sixth conductive layer C6. A third insulating layer INS3 may be further disposed between the fifth conductive layer C5 and the sixth conductive layer C6. The third insulating layer INS3 may cover the first connection electrode CNE1 forming the fifth conductive layer C5 and expose the second end EP2 of the light emitting elements LD. The second connection electrode CNE2 forming the sixth conductive layer C6 may be disposed on the second end EP2 of the light emitting element LD exposed by the third insulating layer INS3. When the third insulating layer INS3 is disposed between the first and second connection electrodes CNE1 and CNE2 forming different conductive layers, the first and second connection electrodes CNE1 and CNE2 may be stably separated by the third insulating layer INS3. Therefore, electrical stability between the first and second ends EP1 and EP2 of the light emitting elements LD may be improved.

The fifth conductive layer C5 and/or the sixth conductive layer C6 may be formed of transparent conductive materials. For example, the fifth conductive layer C5 and/or the sixth conductive layer C6 may include at least one transparent conductive materials such as indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO). The fifth and sixth conductive layers C5 and C6 may be substantially transparent or translucent, and may satisfy a selected light transmittance. Accordingly, the light emitted from the first and second ends EP1 and EP2 of the light emitting elements LD may pass through the first and second connection electrodes CNE1 and CNE2 and may be emitted to an outside of the display panel PNL.

The third insulating layer INS3 may be configured as a single layer or multiple layers, and may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

Figure 10:
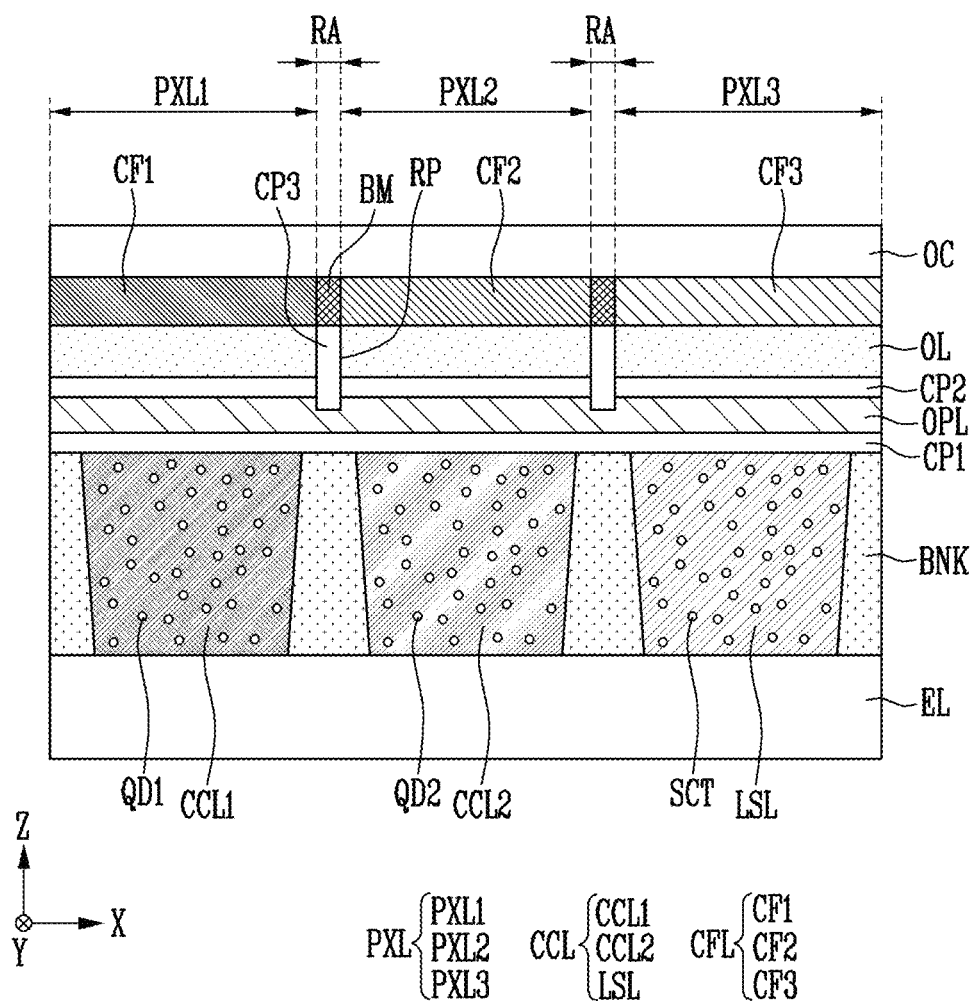
FIGS. 10 and 11 are schematic cross-sectional views illustrating first to third sub-pixels according to an embodiment.
Figure 11:
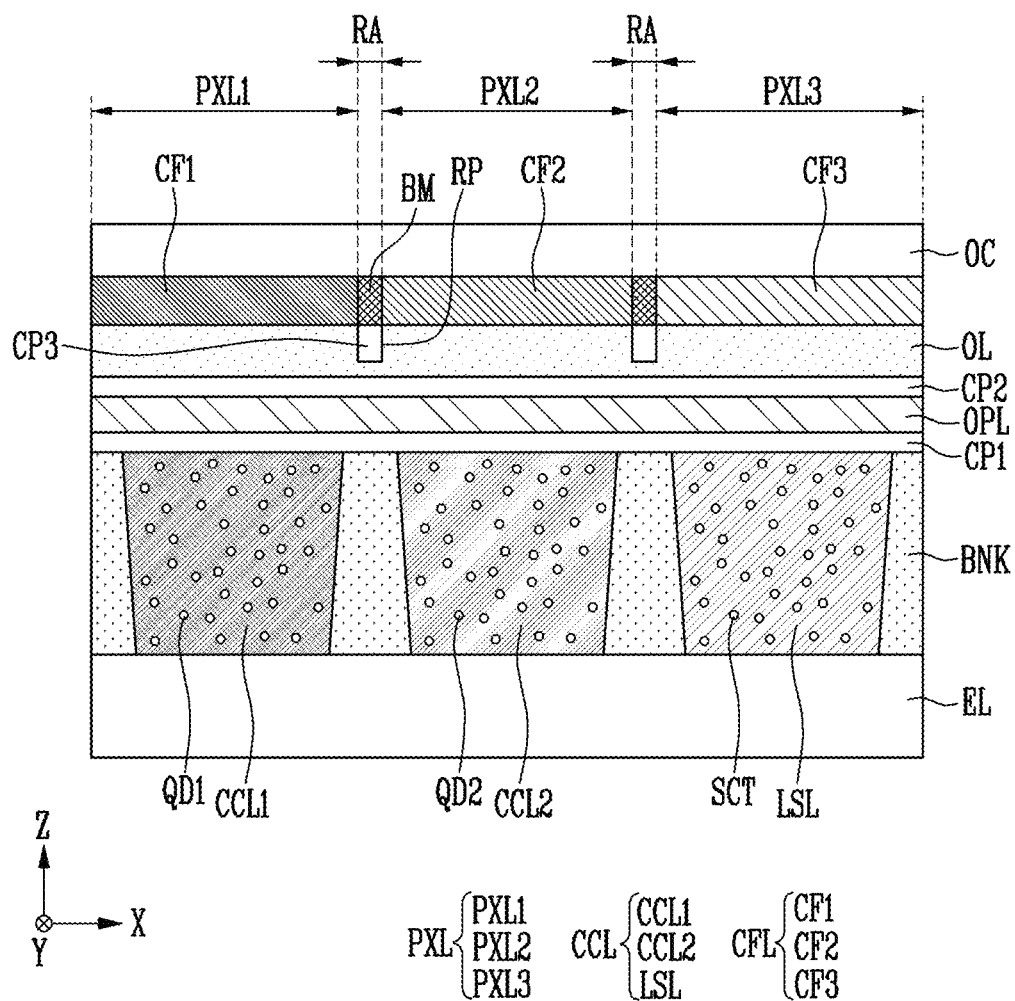

FIGS. 10 and 11 are cross-sectional views illustrating first to third sub-pixels according to an embodiment. FIGS. 10 and 11 show a bank BNK, a color conversion layer CCL, and/or a color filter layer CFL provided on the light emitting element layer EL of the sub-pixel PXL described with reference to FIGS. 8 and 9, and the like.

Referring to FIGS. 10 and 11, the bank BNK may be disposed on the light emitting element layer EL of the first to third sub-pixels PXL1, PXL2, and PXL3. For example, the bank BNK may be disposed between the first to third sub-pixels PXL1, PXL2, and PXL3, and may include an opening overlapping each of the first to third sub-pixels PXL1, PXL2, and PXL3. The opening of the bank BNK may overlap the first to third sub-pixels PXL1, PXL2, and PXL3 in a plan view. The opening of the bank BNK may provide a space in which the color conversion layer CCL may be provided.

The bank BNK may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the bank BNK may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

According to an embodiment, the bank BNK may include at least one light blocking and/or reflective material. Accordingly, light leakage between the adjacent sub-pixels PXL may be prevented. For example, the bank BNK may include at least one black matrix material, color filter material, and/or the like. For example, the bank BNK may be formed of a black opaque pattern capable of blocking light. In an embodiment, a reflective film or the like, which is not shown, may be formed on a surface (for example, a sidewall) of the bank BNK to increase light efficiency of each sub-pixel PXL.

The color conversion layer CCL may be disposed on the light emitting element layer EL including the light emitting elements LD in the opening of the bank BNK.

The color conversion layer CCL may include a first color conversion layer CCL1 disposed in the first sub-pixel PXL1, a second color conversion layer CCL2 disposed in the second sub-pixel PXL2, and a scattering layer LSL disposed in the third sub-pixel PXL3.

In an embodiment, the first to third sub-pixels PXL1, PXL2, and PXL3 may include light emitting elements LD that emit light of the same color. For example, the first to third sub-pixels PXL1, PXL2, and PXL3 may include light emitting elements LD emitting light of a third color (for example, a blue light). The color conversion layer CCL including color conversion particles may be disposed on each of the first to third sub-pixels PXL1, PXL2, and PXL3 to display a full-color image.

The first color conversion layer CCL1 may include first color conversion particles that convert light of the third color emitted from the light emitting element LD into light of the first color. For example, the first color conversion layer CCL1 may include first quantum dots QD1 dispersed in a selected matrix material such as a base resin.

In an embodiment, when the light emitting element LD is a blue light emitting element emitting blue light and the first sub-pixel PXL1 is a red pixel, the first color conversion layer CCL1 may include the first quantum dot QD1 that converts the blue light emitted from the blue light emitting element into red light. The first quantum dot QD1 may absorb the blue light and shift the wavelength according to an energy transition to emit the red light. In case that the first sub-pixel PXL1 is a pixel of a different color, the first color conversion layer CCL1 may include a first quantum dot QD1 corresponding to the color of the first sub-pixel PXL1.

The second color conversion layer CCL2 may include second color conversion particles that convert light of the third color emitted from the light emitting element LD into light of the second color. For example, the second color conversion layer CCL2 may include second quantum dots QD2 dispersed in a selected matrix material such as a base resin.

In an embodiment, when the light emitting element LD is the blue light emitting element emitting the blue light and the second sub-pixel PXL2 is a green pixel, the second color conversion layer CCL2 may include a second quantum dot QD2 that converts the blue light emitted from the blue light emitting element into green light. The second quantum dot QD2 may absorb the blue light and shift a wavelength according to an energy transition to emit the green light. In case that the second sub-pixel PXL2 is a pixel of a different color, the second color conversion layer CCL2 may include a second quantum dot QD2 corresponding to the color of the second sub-pixel PXL2.

In an embodiment, an absorption coefficient of the first quantum dot QD1 and the second quantum dot QD2 may be increased by using a blue light, which has a relatively short wavelength in the visible light region, on each of the first quantum dot QD1 and the second quantum dot QD2. Accordingly, the final efficiency of light emitted from the first sub-pixel PXL1 and the second sub-pixel PXL2 may be improved, and color reproducibility may be improved. Manufacturing efficiency of the display device may also be increased in case that the light emitting unit LSU of the first to third sub-pixels PXL1, PXL2, and PXL3 use the light emitting elements LD of the same color (for example, the blue light emitting element).

The scattering layer LSL may be provided to efficiently use the light of the third color (or blue) emitted from the light emitting element LD. For example, when the light emitting element LD is the blue light emitting element emitting the blue light and the third sub-pixel PXL3 is the blue pixel, the scattering layer LSL may include at least one type of scatterer SCT in order to efficiently use the light emitted from the light emitting element LD.

For example, the scattering layer LSL may include scatterers SCT dispersed in a selected matrix material such as a base resin. For example, the scattering layer LSL may include a scatterer SCT such as silica, but the material of the scatterer SCT is not limited thereto. The scatterer SCT may not be disposed only in the third sub-pixel PXL3, and may also be selectively included in the first color conversion layer CCL1 or the second color conversion layer CCL2. According to an embodiment, the scatterer SCT may be omitted to provide the scattering layer LSL formed of a transparent polymer.

A first capping layer CP1 may be disposed on the color conversion layer CCL. The first capping layer CP1 may be provided over the first to third sub-pixels PXL1, PXL2, and PXL3. The first capping layer CP1 may cover the color conversion layer CCL. The first capping layer CP1 may prevent impurities such as moisture or air from penetrating from the outside and damaging or contaminating the color conversion layer CCL.

The first capping layer CP1 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like.

An optical layer OPL may be disposed on the first capping layer CP1. The optical layer OPL may be provided over the first to third sub-pixels PXL1, PXL2, and PXL3.

The optical layer OPL may serve to improve light extraction efficiency by recycling light provided from the color conversion layer CCL by total reflection. The optical layer OPL may have a relatively low refractive index compared to the color conversion layer CCL to recycle the light. For example, the refractive index of the color conversion layer CCL may be about 1.6 to about 2.0, and the refractive index of the optical layer OPL may be about 1.1 to about 1.3, but the embodiments are not limited thereto.

According to an embodiment, the optical layer OPL may include a base resin and a hollow particle dispersed in the base resin. The hollow particle may include a hollow silica particle. In other examples, the hollow particle may be a pore formed by a porogen, but the embodiments are not limited thereto. The optical layer OPL may include at least one of a zinc oxide (ZnO) particle, a titanium dioxide (TiO2) particle, and a nano silicate particle, but the embodiments are not limited thereto.

A second capping layer CP2 may be disposed on the optical layer OPL. The second capping layer CP2 may be provided over the first to third sub-pixels PXL1, PXL2, and PXL3. The second capping layer CP2 may cover the optical layer OPL. The second capping layer CP2 may prevent impurities such as moisture or air from penetrating from the outside and damaging or contaminating the optical layer OPL.

The second capping layer CP2 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like.

An organic layer OL may be disposed on the second capping layer CP2. The organic layer OL may be provided over the first to third sub-pixels PXL1, PXL2, and PXL3.

The organic layer OL may include an organic material such as acrylates resin, epoxy resin, phenolic resin, polyamides resin, polyimides resin, polyester resin, polyphenylenesulfides resin, or benzocyclobutene (BCB).

At least one of the optical layer OPL and the organic layer OL may include recess patterns RP formed in the recess portions RA. As described above, when the recess patterns RP are formed in the optical layer OPL and/or the organic layer OL, since the shrinkage stress may be dispersed in a process in which the optical layer OPL and/or the organic layer OL are/is deformed, the reliability of the display panel PNL may be improved by minimizing warpage as described above.

In an embodiment, as shown in FIG. 10, the optical layer OPL and the organic layer OL may include the recess patterns RP formed in the recess portion RA. The recess patterns RP may be formed by partially removing the optical layer OPL and the organic layer OL from the recess portion RA. For example, a depth of the third direction (Z-axis direction) of the recess patterns RP may be formed to be 25% to 55% of a thickness of the third direction (Z-axis direction) of the optical layer OPL and the organic layer OL, but the embodiments are not limited thereto.

In other embodiments, as shown in FIG. 11, only the organic layer OL may include the recess patterns RP formed in the recess portion RA. The recess patterns RP may be formed by partially removing the organic layer OL from the recess portion RA. For example, the depth of the third direction (Z-axis direction) of the recess patterns RP may be formed to be 25% to 55% of the thickness of the third direction (Z-axis direction) of the organic layer OL, but the embodiments are not limited thereto. The depth of the third direction (Z-axis direction) of the recess patterns RP may be changed within a range capable of dispersing the shrinkage stress of the optical layer OPL or the organic layer OL.

A third capping layer CP3 may be disposed in the recess patterns RP. The third capping layer CP3 may be disposed in between the first to third sub-pixels PXL1, PXL2, and PXL3. For example, in a plan view, third capping layer CP3 may not overlap the first to third sub-pixels PXL1, PXL2, and PXL3, but the embodiments are not limited thereto.

The third capping layer CP3 may be an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), or the like. According to an embodiment, the third capping layer CP3 may be omitted.

The color filter layer CFL may be disposed on the organic layer OL. The color filter layer CFL may include color filters CF1, CF2, and CF3 matching the colors of each sub-pixel PXL. As the color filters CF1, CF2, and CF3 matching the colors of each of the first to third sub-pixels PXL1, PXL2, and PXL3 are disposed, the full-color image may be displayed.

The color filter layer CFL may include the first color filter CF1 disposed in the first sub-pixel PXL1 to selectively transmit light emitted from the first sub-pixel PXL1, the second color filter CF2 disposed in the second sub-pixel PXL2 to selectively transmit light emitted from the second sub-pixel PXL2, and the third color filter CF3 disposed in the third sub-pixel PXL3 to selectively transmit light emitted from the third sub-pixel PXL3.

In an embodiment, the first color filter CF1, the second color filter CF2, and the third color filter CF3 may be a red color filter, a green color filter, and a blue color filter, respectively, but are not limited thereto. Hereinafter, two or more of the first color filter CF1, the second color filter CF2, and the third color filter CF3 may be collectively referred to as "color filters CF," and any of these color filters may be individually referred to as a "color filter CF."

The first color filter CF1 may overlap the light emitting element layer EL (or the light emitting element LD) and the first color conversion layer CCL1 of the first sub-pixel PXL1 in the third direction (Z-axis direction). The first color filter CF1 may include a color filter material that selectively transmits the light of the first color (or red). For example, when the first sub-pixel PXL1 is the red pixel, the first color filter CF1 may include a red color filter material.

The second color filter CF2 may overlap the light emitting element layer EL (or the light emitting element LD) and the second color conversion layer CCL2 of the second sub-pixel PXL2 in the third direction (Z-axis direction). The second color filter CF2 may include a color filter material that selectively transmits the light of the second color (or green). For example, when the second sub-pixel PXL2 is the green pixel, the second color filter CF2 may include a green color filter material.

The third color filter CF3 may overlap the light emitting element layer EL (or the light emitting element LD) and the scattering layer LSL of the third sub-pixel PXL3 in the third direction (Z-axis direction). The third color filter CF3 may include a color filter material that selectively transmits the light of the third color (or blue). For example, when the third sub-pixel PXL3 is the blue pixel, the third color filter CF3 may include a blue color filter material.

According to an embodiment, a light blocking layer BM may be further disposed among the first to third color filters CF1, CF2, and CF3. As described above, the light blocking layer BM is formed among the first to third color filters CF1, CF2, and CF3, a color mixture defect visually recognized from a front or side of the display device. A material of the light blocking layer BM is not particularly limited, and may be formed of other light blocking materials. For example, the light blocking layer BM may be implemented by stacking the first to third color filters CF1, CF2, and CF3 on each other.

An overcoat layer OC may be disposed on the color filter layer CFL. The overcoat layer OC may be provided over the first to third sub-pixels PXL1, PXL2, and PXL3. The overcoat layer OC may cover a lower member including the color filter layer CFL. The overcoat layer OC may prevent moisture or air from penetrating into the above-described lower member. The overcoat layer OC may protect the above-described lower member from a foreign substance such as dust.

The overcoat layer OC may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited thereto, and the overcoat layer OC may include inorganic materials including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), or titanium oxide (TiOx).

According to the embodiments, the recess patterns RP formed in the optical layer OPL and/or the organic layer OL may disperse the shrinkage stress which may occur in the process in which the optical layer OPL and/or the organic layer OL are/is deformed. Therefore, the reliability of the display panel PNL may be improved by minimizing the warpage phenomenon.

In the following embodiment, the same elements as those described above are referred by the same reference numerals, and repeated descriptions may be omitted or simplified.

Figure 12:
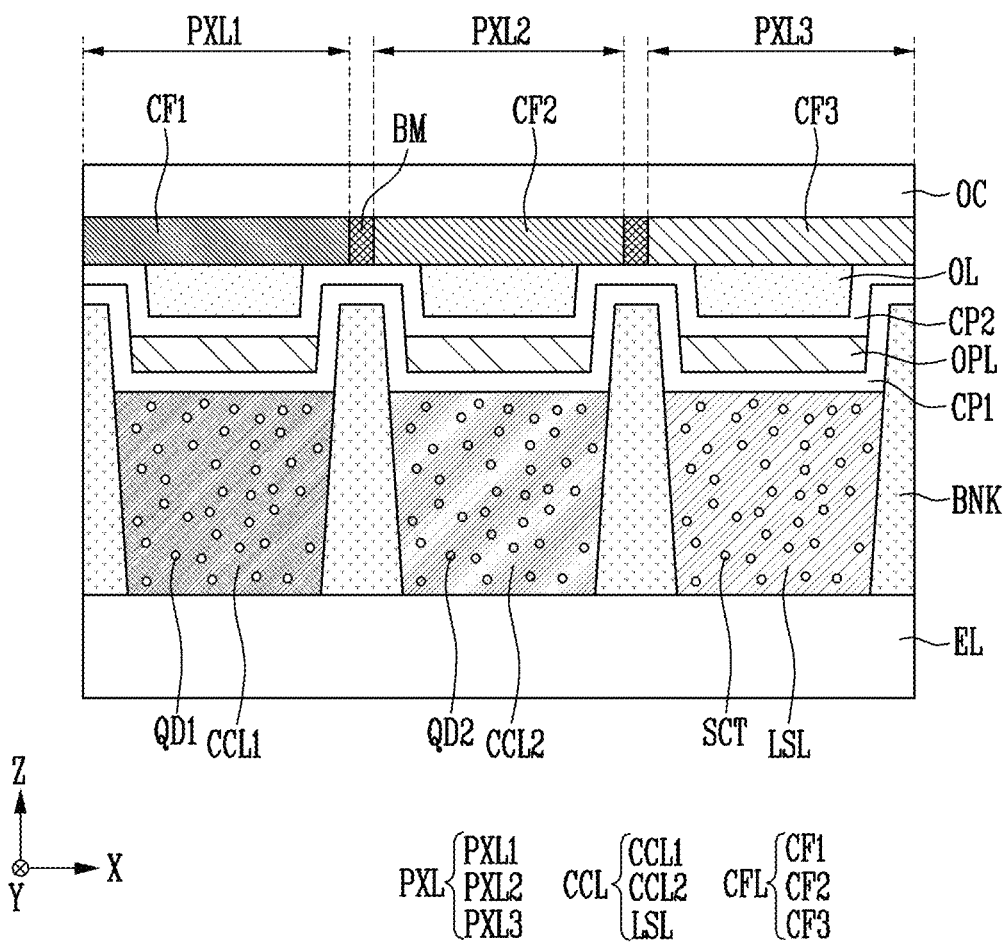
FIG. 12 is a schematic cross-sectional view illustrating first to third sub-pixels according to an embodiment.

FIG. 12 is a schematic cross-sectional view illustrating the first to third sub-pixels according to an embodiment.

Referring to FIG. 12, the embodiment is distinguished from the embodiment of FIGS. 1 to 11 in that the color conversion layer CCL, the optical layer OPL, and/or the organic layer OL are/is disposed in the opening of the bank BNK.

For example, the bank BNK may be disposed in between the first to third sub-pixels PXL1, PXL2, and PXL3, and may include an opening overlapping each of the first to third sub-pixels PXL1, PXL2, and PXL3. The color conversion layer CCL, the optical layer OPL, and/or the organic layer OL may be disposed in the opening of the bank BNK. The bank BNK may separate the color conversion layer CCL, the optical layer OPL, and/or the organic layer OL of each of the first to third sub-pixels PXL1, PXL2, and PXL3.

In a plan view, the bank BNK may separate a portion of the optical layer OPL that overlaps the first sub-pixel PXL1 from a portion of the optical layer OPL that overlaps the second sub-pixel PXL2. Similarly, the bank BNK may separate portions of the organic layer OL that overlap the first and second sub-pixels PXL1 and PXL2. The bank BNK may separate portions of the optical layer OPL and the organic layer OL that overlap the second and third sub-pixels PXL2 and PXL3 from each other.

The color conversion layer CCL may be disposed on the light emitting element layer EL including the light emitting elements LD in the opening of the bank BNK. The optical layer OPL may be disposed on the color conversion layer CCL in the opening of the bank BNK. The organic layer OL may be disposed on the optical layer OPL in the opening of the bank BNK. As described above, when the optical layer OPL and/or the organic layer OL of each of the sub-pixels PXL are/is disposed in the opening of the bank BNK and separated from each other, the shrinkage stress generated in the process where the optical layer OPL and the organic layer OL are repeatedly stacked and cured may be dispersed. Therefore, the reliability of the display panel PNL may be improved by minimizing the warpage phenomenon.

In an embodiment, a height in the third direction (Z-axis direction) of the bank BNK of the first area A1 of FIG. 3 may be different from a height of the third direction (Z-axis direction) of the bank BNK of the second area A2 of FIG.

3. For example, the height of the third direction (Z-axis direction) of the bank BNK of the first area A1 may be less from the height of the third direction (Z-axis direction) of the bank BNK of the second area A2. As described above, when the bank BNK high in the second area A2 corresponding to the outer portion, the shrinkage stress of the second area A2 may be dispersed. Therefore, the warpage phenomenon may be minimized. However, the disclosure is not limited thereto, and the height of the third direction (Z-axis direction) of the bank BNK of the first area A1 may be formed to be substantially the same as the height of the third direction (Z-axis direction) of the bank BNK of the second area A2.

The first capping layer CP1 may be disposed between the color conversion layer CCL and the optical layer OPL. The second capping layer CP2 may be disposed between the optical layer OPL and the organic layer OL. The first capping layer CP1 and/or the second capping layer CP2 may be provided over the first to third sub-pixels PXL1, PXL2, and PXL3.

Since the bank BNK, the color conversion layer CCL, the optical layer OPL, the organic layer OL, the first capping layer CP1, and the second capping layer CP2 are described in detail with reference to FIGS. 10 and 11, their descriptions will not be repeated.

Subsequently, a method of manufacturing the display device according to the embodiments is described.

FIGS. 13 to 16 are schematic cross-sectional views of process steps illustrating a method of manufacturing a display device according to an embodiment. FIGS. 13 to 16 are schematic cross-sectional views illustrating the method of manufacturing the display device of FIG. 10, and substantially the same components as those of FIG. 10 are denoted by the same reference numerals and detailed reference numerals are omitted.

Figure 13:
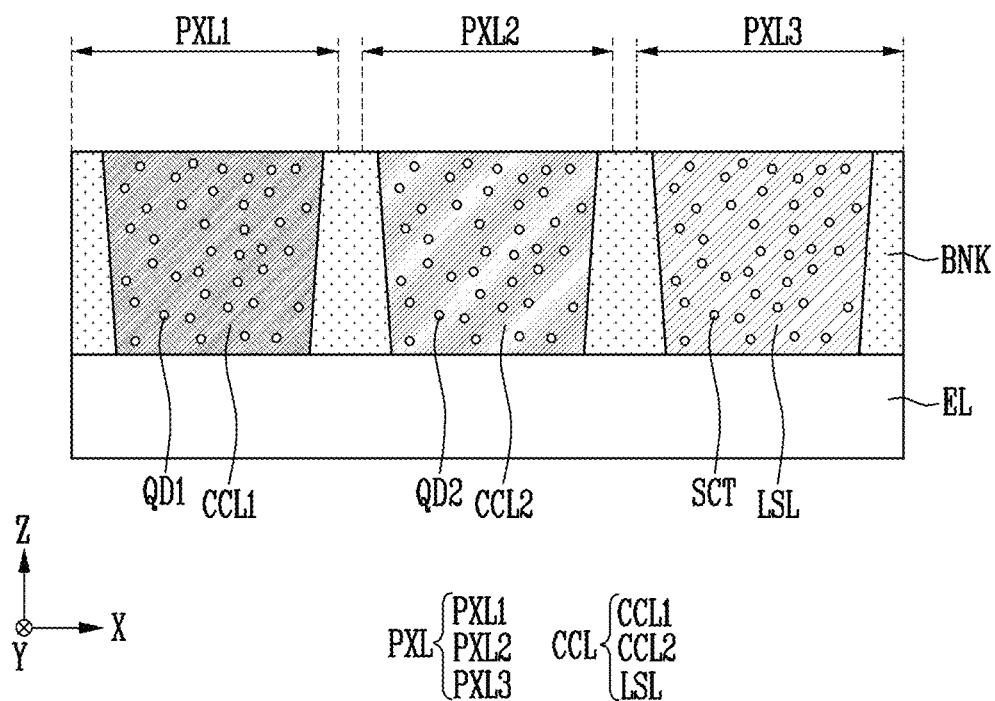
FIGS. 13 to 16 are schematic cross-sectional views for each process step illustrating a method of manufacturing a display device according to an embodiment.

Referring to FIG. 13, first, the bank BNK is formed, and the color conversion layer CCL is formed between the banks BNK. The bank BNK may be formed on the light emitting element layer EL of the sub-pixels PXL.

The bank BNK may be formed between the first to third sub-pixels PXL1, PXL2, and PXL3, and may include the opening overlapping each of the first to third sub-pixels PXL1, PXL2, and PXL3. The color conversion layer CCL may be formed in the opening of the bank BNK. The first color conversion layer CCL1 may be formed in the opening of the bank BNK of the first sub-pixel PXL1. The second color conversion layer CCL2 may be formed in the opening of the bank BNK of the second sub-pixel PXL2. The scattering layer LSL may be formed in the opening of the bank BNK of the third sub-pixel PXL3.

Figure 14:
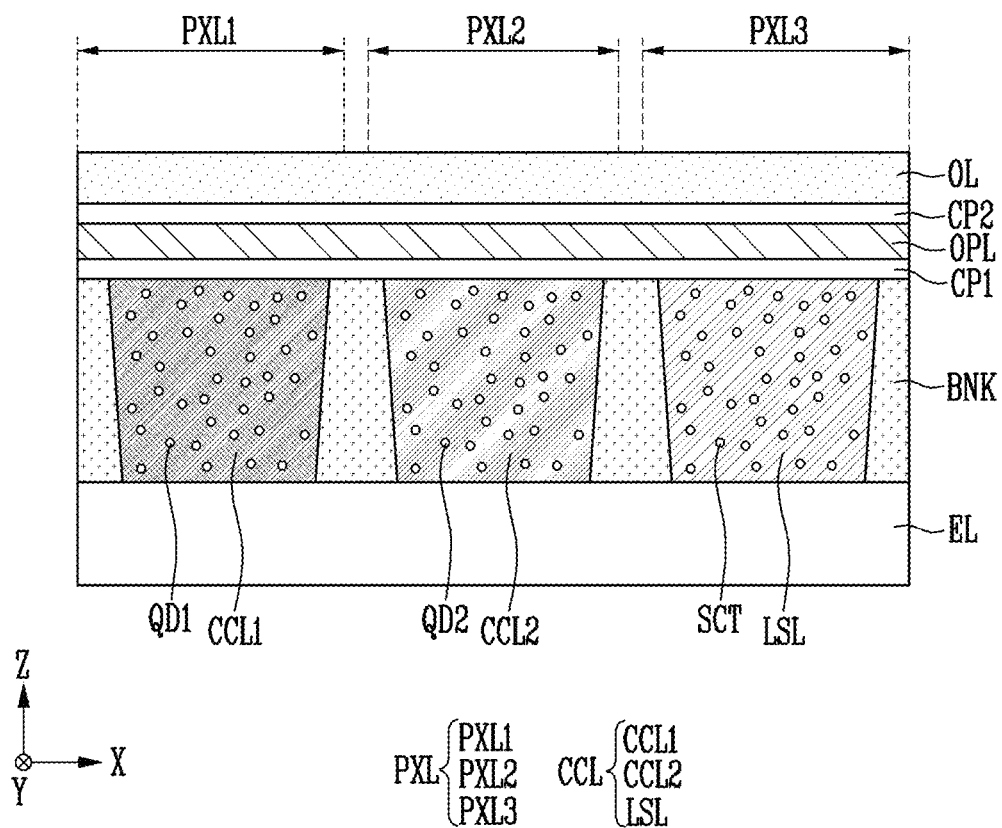

Referring to FIG. 14, subsequently, the first capping layer CP1, the optical layer OPL, the second capping layer CP2, and/or the organic layer OL are/is formed. The first capping layer CP1, the optical layer OPL, the second capping layer CP2, and/or the organic layer OL may be sequentially formed on the bank BNK and the color conversion layer CCL. The first capping layer CP1, the optical layer OPL, the second capping layer CP2, and/or the organic layer OL may be formed over the first to third sub-pixels PXL1, PXL2, and PXL3.

Figure 15:
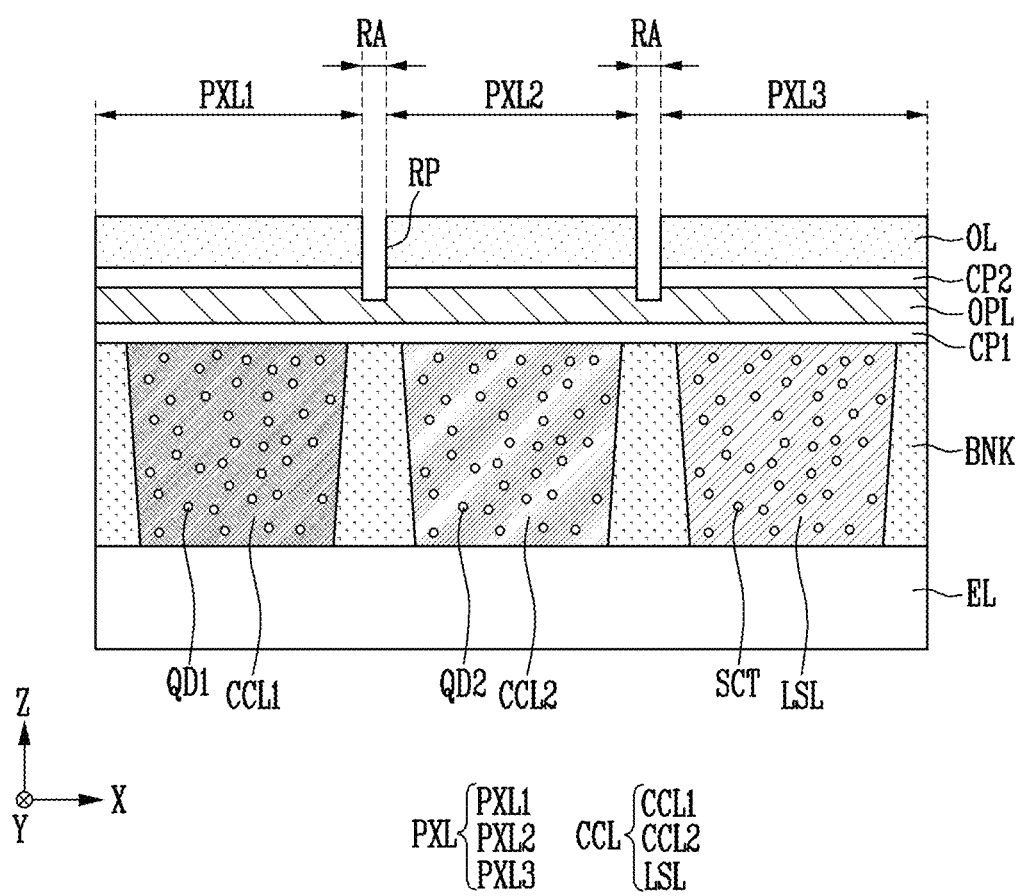

Referring to FIG. 15, subsequently, the recess patterns RP are formed in the recess portion RA. The recess portion RA may be positioned at the boundaries of the first to third sub-pixels PXL1, PXL2, and PXL3. The recess patterns RP may be formed by partially removing the optical layer OPL and/or organic layer OL. A process of forming the recess patterns RP may be performed by an ordinary etching process such as a dry etching method, a wet etching method, a reactive ion etching (RIE) method, and an inductively coupled plasma reactive ion etching (ICP-RIE) method, but the embodiments are not limited thereto.

Figure 16:
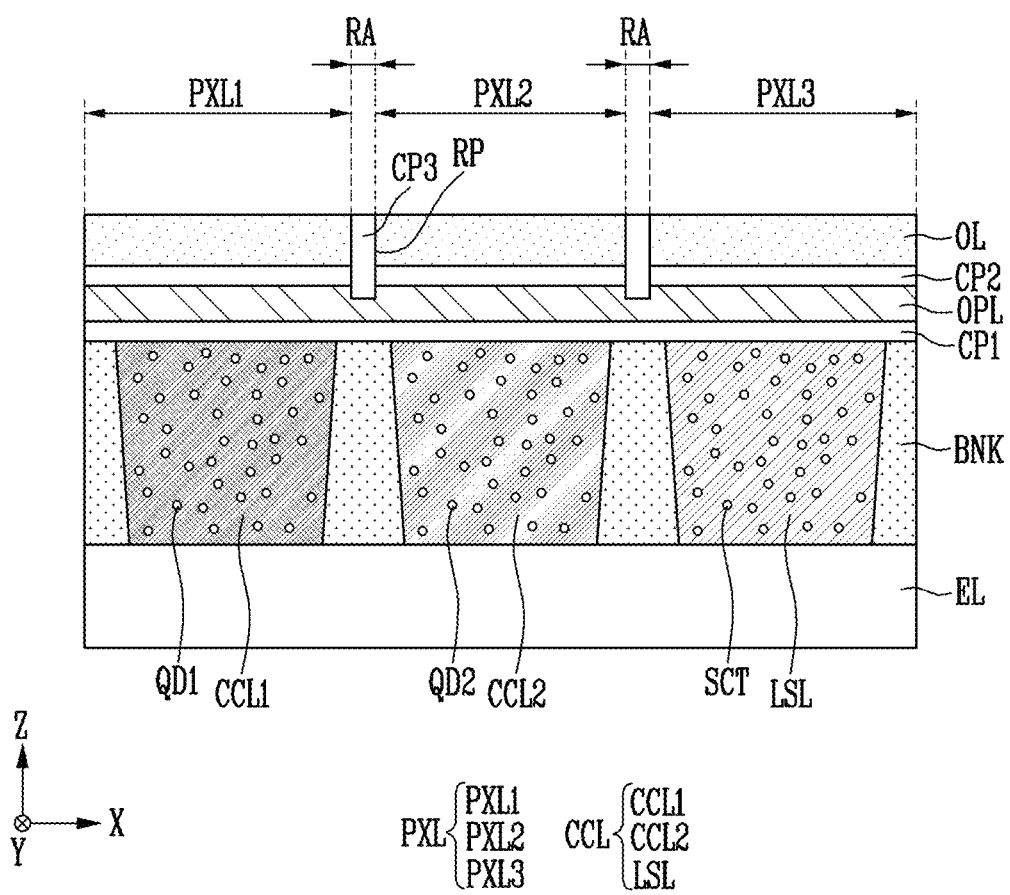

Referring to FIG. 16, subsequently, the third capping layer CP3 is then formed in the recess patterns RP. The third capping layer CP3 may be partially provided only inside the recess patterns RP. For example, the third capping layer CP3 may be formed only within the recess portion RA between the first to third sub-pixels PXL1, PXL2, and PXL3.

Subsequently, the color filter layer CFL may be formed, and thus the display device of FIG. 10 may be completed. The color filter layer CFL may include the first color filter CF1 formed in the first sub-pixel PXL1, the second color filter CF2 formed in the second sub-pixel PXL2, and the third color filter CF3 formed in the third sub-pixel PXL3. The light blocking layer BM may be disposed among the first to third sub-pixels PXL1, PXL2, and PXL3.

According to the embodiments, as the recess patterns RP are formed in the optical layer OPL and/or the organic layer OL, the shrinkage stress may be dispersed in case that the optical layer OPL and/or the organic layer OL are deformed. Therefore, the reliability of the display panel PNL may be improved by minimizing the warpage phenomenon.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   pixels, each of the pixels including light emitting elements disposed in the pixels;
   a color conversion layer disposed on the light emitting elements of the pixels, the color conversion layer including quantum dots dispersed in a base resin;
   an optical layer disposed on the color conversion layer; and
   an organic layer disposed on the optical layer, wherein
   both of the optical layer and the organic layer include recess patterns disposed between the pixels,
   the organic layer overlaps the optical layer in plan view, and
   the recess patterns are formed by etching the optical layer and the organic layer.

2. The display device according to claim 1, further comprising:
   a first capping layer disposed between the color conversion layer and the optical layer; and
   a second capping layer disposed between the optical layer and the organic layer.

3. The display device according to claim 1, further comprising:
   a third capping layer disposed in the recess patterns.

4. The display device according to claim 3, wherein
   the third capping layer does not overlap the pixels in a plan view, and
   the third capping layer is disposed only in the recess patterns.

5. A display device comprising:
pixels, each of the pixels including light emitting elements disposed in the pixels;
a color conversion layer disposed on the light emitting elements of the pixels;
an optical layer disposed on the color conversion layer;
an organic layer disposed on the optical layer; and
a central portion; and
an outer portion surrounding the central portion, wherein at least one of the optical layer and the organic layer includes recess patterns disposed between the pixels, and
a number of the recess patterns disposed per unit area in the central portion is less than a number of the recess patterns disposed per unit area in the outer portion.

6. The display device according to claim 1, further comprising:
a central portion; and
an outer portion surrounding the central portion, wherein a depth of the recess patterns disposed in the central portion is less than a depth of the recess patterns disposed in the outer portion.

7. The display device according to claim 1, further comprising:
banks disposed between the pixels, wherein the color conversion layer is disposed between the banks.

8. The display device according to claim 1, further comprising:
a color filter layer disposed on the organic layer.

9. The display device according to claim 1, wherein a refractive index of the optical layer is about 1.1 to about 1.3.

10. The display device according to claim 9, wherein the optical layer includes a hollow particle.

11. The display device according to claim 1, wherein the recess patterns are formed by etching the optical layer and the organic layer from a top side after deposition of both the optical layer and the organic layer.

\* \* \* \* \*